United States Patent
Blakes

(10) Patent No.: US 8,441,764 B2
(45) Date of Patent: May 14, 2013

(54) QUENCH PROPAGATION CIRCUIT FOR SUPERCONDUCTING MAGNETS

(75) Inventor: Hugh Alexander Blakes, Oxfordshire (GB)

(73) Assignee: Siemens Plc, Frimley, Camberley (GB)

( * ) Notice: Subject to any disclaimer, the term of this patent is extended or adjusted under 35 U.S.C. 154(b) by 461 days.

(21) Appl. No.: 12/756,572

(22) Filed: Apr. 8, 2010

(65) Prior Publication Data
US 2010/0283565 A1 Nov. 11, 2010

(30) Foreign Application Priority Data
May 8, 2009 (GB) .................................. 0907910.4

(51) Int. Cl.
*H02H 9/00* (2006.01)
(52) U.S. Cl.
USPC .................................. 361/19; 361/10; 361/11
(58) Field of Classification Search .................... 361/10, 361/11, 19
See application file for complete search history.

(56) References Cited

U.S. PATENT DOCUMENTS 6,147,844 A * 11/2000 Huang et al. .................... 361/19
7,492,556 B2 2/2009 Atkins et al.
2006/0291112 A1 12/2006 Markiewicz

FOREIGN PATENT DOCUMENTS

| CN | 1835318 A | 9/2006 |
|---|---|---|
| GB | 2 422 958 A | 8/2006 |
| GB | 2 456 308 A | 7/2009 |

OTHER PUBLICATIONS

Great Britain Search Report dated Sep. 8, 2009 (Four (4) pages).

* cited by examiner

*Primary Examiner* — Stephen W Jackson
*Assistant Examiner* — Tien Mai
(74) *Attorney, Agent, or Firm* — Crowell & Moring LLP

(57) ABSTRACT

A quench propagation arrangement for a superconducting magnet comprising a plurality of series-connected superconducting coils, the arrangement comprising: a positive supply line connected to cathodes of first diodes, of which respective anodes are connected to each respective node of the series connection of superconducting coils; a negative supply line connected to anodes of second diodes, of which respective cathodes are connected to each respective node of the series connection of superconducting coils; a number of heaters, respectively thermally connected to each of the superconducting coils and electrically connected between the positive supply line and the negative supply line; and a voltage limiter connected between the positive supply line and the negative supply line, in parallel with the heaters.

5 Claims, 3 Drawing Sheets

PRIOR ART

QUENCH PROPAGATION CIRCUIT FOR SUPERCONDUCTING MAGNETS

The present invention relates to cryogenically cooled superconducting magnet arrangements. In particular, it relates to quench propagation circuits, provided in association with superconducting magnets made up of a plurality of coils of superconducting wire electrically connected in series.

In operation, the coils of superconducting wire are cooled to a temperature at which superconductivity is possible. An electric current is introduced into the coils by an external power supply in a process known as ramping up. A superconducting switch then closes the circuit through the superconducting coils, and the electric current continues to flow, in the so-called persistent mode.

For any of several reasons, one part of a magnet coil may cease to be superconducting. For example, a defect in the superconducting wire, a sudden movement of part of the wire, a mechanical impact, or action of an external heat source may cause a part of a magnet coil to cease to be superconducting, and revert to its "normal", resistive mode. The current continues to circulate through the coil, and ohmic heating at the resistive part causes adjacent parts of the coil to become resistive. The result is that the whole coil becomes resistive, and heats up as energy formerly stored in the magnetic field is dissipated and the current diminishes. Usually, arrangements are made to spread a quench over all coils within a magnet, so that no single coil needs to dissipate all of the energy stored in the magnetic field, which might otherwise damage the coil by overheating. These arrangements are quench propagation circuits, the subject of the present invention.

FIG. 1 shows a conventional arrangement of a cryostat including a cryogen vessel 12. A cooled superconducting magnet 10 is provided within cryogen vessel 12, itself retained within an outer vacuum chamber (OVC) 14. One or more thermal radiation shields 16 are provided in the vacuum space between the cryogen vessel 12 and the outer vacuum chamber 14. In some known arrangements, a refrigerator 17 is mounted in a refrigerator sock 15 located in a turret 18 provided for the purpose, towards the side of the cryostat. Alternatively, a refrigerator 17 may be located within access turret 19, which retains access neck (vent tube) 20 mounted at the top of the cryostat. The refrigerator 17 provides active refrigeration to cool cryogen gas within the cryogen vessel 12, in some arrangements by recondensing it into a liquid. The refrigerator 17 may also serve to cool the radiation shield 16. As illustrated in FIG. 1, the refrigerator 17 may be a two-stage refrigerator. A first cooling stage is thermally linked to the radiation shield 16, and provides cooling to a first temperature, typically in the region of 80-100K. A second cooling stage provides cooling of the cryogen gas to a much lower temperature, typically in the region of 4-10K.

A negative electrical connection 21a is usually provided to the magnet 10 through the body of the cryostat. A positive electrical connection 21 is usually provided by a conductor passing through the vent tube 20.

Superconducting magnets with multiple coils need protection from excessive voltages and temperatures during a quench. Quench typically begins in a single quenching coil and the energy released usually needs to be deliberately spread to the other coils within a second or so in order that the energy is not all released into the quenching coil alone, to prevent it from being damaged due to excess heating or excess voltage.

Recent developments in the design of superconducting magnets have led to higher magnetic fields for reduced wire mass. The requirement to spread a quench rapidly becomes more important with such designs, as greater energy is stored in the magnetic field, and the reduced thermal mass of the wire means that peak wire temperatures may be higher during a quench. Quench propagation should accordingly be accomplished faster in order to protect such magnets effectively.

One common approach to solving this problem is to connect small heaters across at least some of the coils, such that when a quench produces a resistive or inductive voltage in one coil, this voltage is used to power the small heaters embedded in other coils to cause them to quench. This spreads the dissipating energy to the rest of the magnet, so protecting the initially quenching coil.

For some magnet designs, known quench propagation arrangements do not react fast enough to protect the coils. For example, despite the use of quench propagation arrangements, voltages may arise during a quench which are in excess of what can reasonably be protected against. This has led to design restrictions on the minimum wire mass used in the construction of the coils. It would be beneficial to reduce the minimum wire mass, to reduce the material and transport costs of the magnet, and to produce a smaller, lighter magnet which will appeal to customers and patients.

Accordingly, the present invention provides quench propagation arrangements for a superconducting magnet as set out in the appended claims.

The above, and further, objects, characteristics and advantages of the present invention will become more apparent from consideration of the following example embodiments of the present invention, given by way of non-limiting examples only, in conjunction with the accompanying drawings wherein.

A difficulty which arises in the design and implementation of quench propagation circuits lies in finding suitable electrical connection points for the heaters. Connection points need to be found which rapidly give a useful voltage to power the heaters, regardless of which coil is quenching, yet which do not produce an excessively high peak voltage and power in excess of the heaters' capability.

Figure 1:
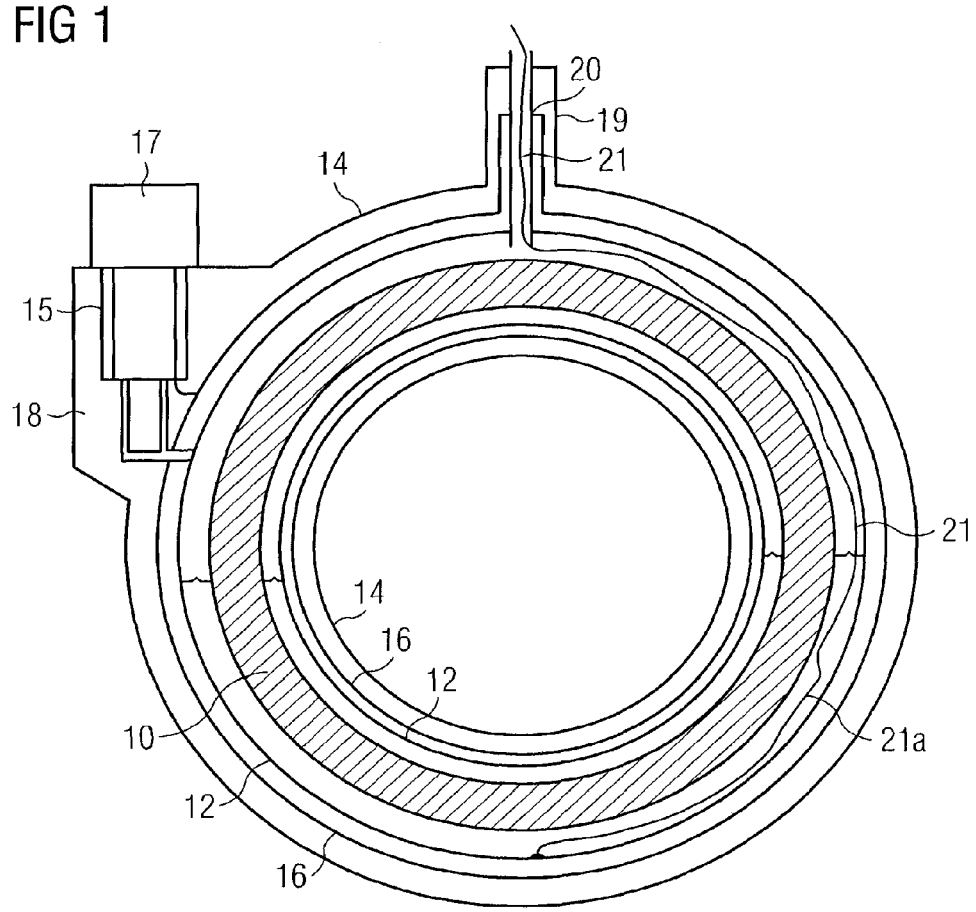
FIG. 1 shows a conventional arrangement of a cryostat including a cryogen vessel.
Figure 2:
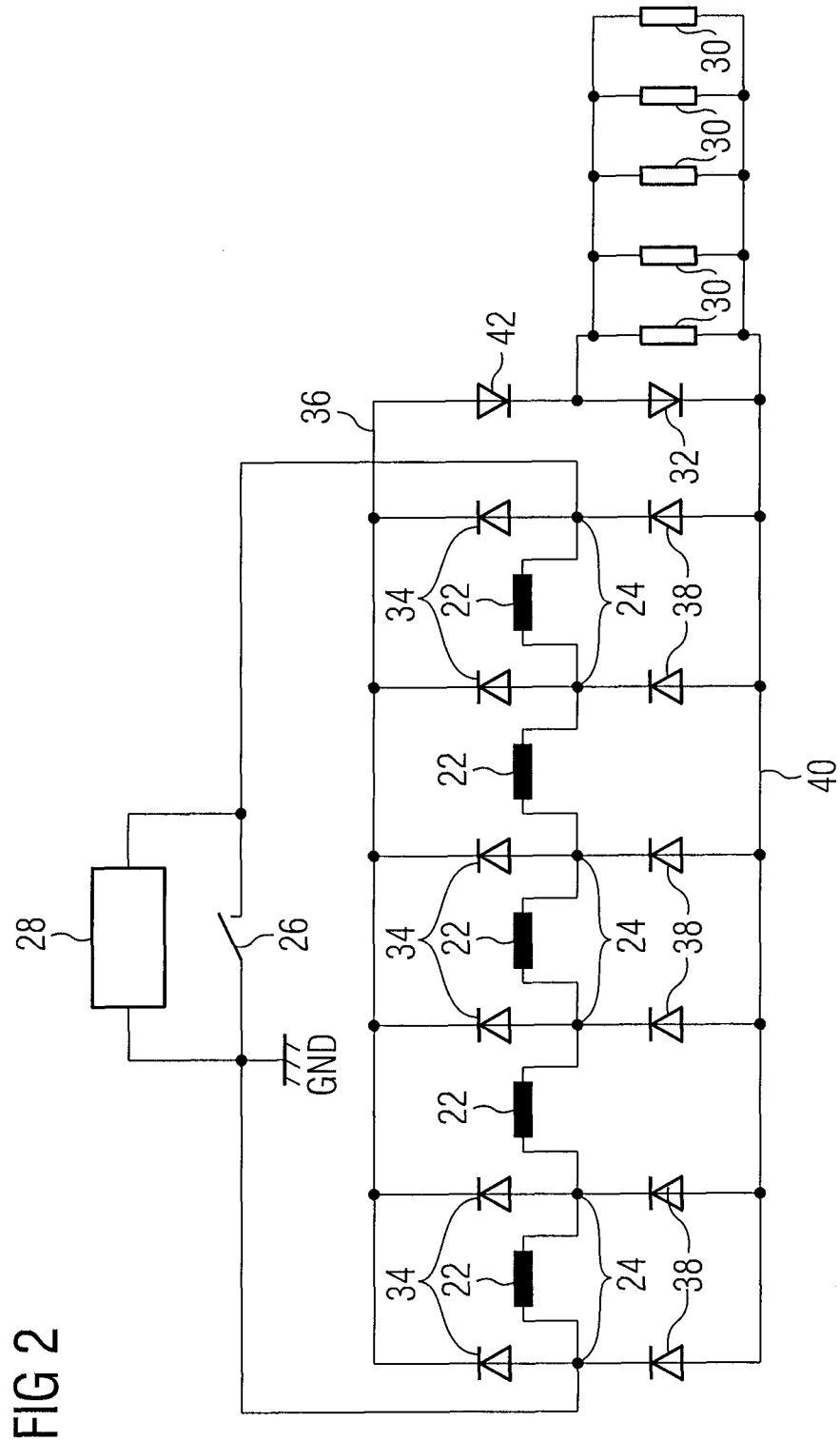
FIG. 2 shows a circuit diagram of a quench propagation arrangement according to an embodiment of the present invention.

In the embodiment of FIG. 2, a number of superconducting coils 22 are connected in series. Either side of each coil is a node 24. A superconducting switch 26 operates to close a circuit consisting of the series connection of coils 22, and the superconducting switch 26. As is conventional, the superconducting switch 26 closes, that is, becomes superconductive, to allow current to flow through it when the magnet is in persistent mode. The switch opens, that is, becomes resistive, when it is desired to introduce or remove electric current using an external power supply 28. Quench heaters 30, typically lengths of resistive wire, are placed in thermal contact with respective coils 22. They are electrically connected together, in this example being connected in parallel.

According to an aspect of the present invention, a voltage limiter 32 is electrically connected across the group of quench heaters. The voltage limiter 32 restricts the voltage which may appear across the heaters 30 to a predetermined level, for example 5V. The voltage limiter may be a forward-biased diode, as illustrated. More than one diode may be placed in series if it is required to limit the voltage across the heaters to a greater value. Other types of voltage limiter may alternatively be provided, as appropriate.

Each of the nodes 24 is connected to two diodes. A first diode 34 in each case has its anode connected to the node 24 and its cathode connected to a positive supply line 36. A second diode 38 in each case has its cathode connected to the node 24 and its anode connected to a negative supply line 40.

The parallel combination of the voltage limiter 32 and the heaters 30 is connected between the positive supply line 36 and the negative supply line 40. A propagation diode 42 may be provided in series between the positive supply line 36 and the parallel combination of the voltage limiter 32 and the heaters 30, as will be explained in more detail below. Alternatively, a propagation diode may be provided in series between the negative supply line 40 and the parallel combination of the voltage limiter 32 and the heaters 30. In operation, when a current is introduced into the magnet from the external power source, the driving voltage is insufficient to overcome the forward voltage of the diodes used, and no current flows in the quench propagation circuit of the present invention. In persistent mode, the coils 22 and the superconducting switch 26 are superconducting. As there is zero, or very little, resistance in the circuit, voltages do not exceed the forward voltage of the diodes used, and no current flows in the quench propagation circuit of the present invention.

Should a quench begin in one of the coils 22, that coil will start to become resistive. The current flowing in the magnet will give rise to a voltage across the coil, due to the resistance of the quenched part of the coil. This will cause heating in the coil, and a reduction in the current flowing through the highly inductive magnet. This reduction in current will also cause an inductive voltage to appear across the other coils. Depending on which coil is quenching, and the direction of current flow through the magnet, consecutive nodes 24 will begin to exhibit a potential difference. At the more positive of these nodes, the first diode 34 will be forward biased, and the second diode 38 reverse biased. At the more negative of these nodes, the first diode 34 will be reverse biased, and the second diode 38 forward biased. Due to the size of the current typically flowing in a superconducting magnet, the potential difference will rapidly exceed the forward voltages of the diodes 34 and 38. Current will flow from the more positive node 24 through first diode 34 to the positive supply line 36. The current will then flow through the combination of diode 42 and heaters 30 to the negative supply line 40 and on to the more negative node 24. While the voltage appearing across the heaters 30 does not exceed the limiting voltage set by voltage limiter 32, no current will flow through the current limiter 32, and the heaters 30 will rapidly heat up, effectively propagating the quench to other coils. Once the voltage appearing across the heaters 30 exceeds the limiting voltage set by voltage limiter 32, current will flow through the current limiter 32, preventing damage to the heaters.

The circuit of FIG. 2 therefore provides rapid activation of the heaters 30, yet protects them from overheating, and excessive voltages. During a quench event, each node is clamped such that its voltage may not exceed the ground voltage GND by more than the sum of the diode forward voltages and the limiting voltage of the voltage limiter 32. No high-voltage wiring is required for any part of the quench propagation arrangement of the present invention.

As shown in FIG. 2, a propagation diode 42 is provided, in series between the positive supply line 36 and the parallel combination of voltage limiter 32 and heater 30 arrangement. This diode serves to ensure that the ramp voltage (typically 10V) is insufficient to forward bias the series connection of diodes 34 and 38, typically, approximately 5V is required per diode at cryogenic temperatures. Diode 42 thus prevents current flowing in the heaters until the potential difference between positive supply line 36 and negative supply line 40 reaches approximately 15V.

Due to the arrangement of diodes provided by the present invention, it is not necessary to provide a specific protection diode for the superconducting switch. The series connection of diodes 34, 42, 32, 38 provides a limit to the voltage which may appear across the superconducting switch 26.

As will be apparent to those skilled in the art, high current diodes of known type should be used in the quench propagation arrangement of the present invention, having a current carrying capacity sufficient to meet expected worst-case operating conditions during a quench event.

Figure 3:
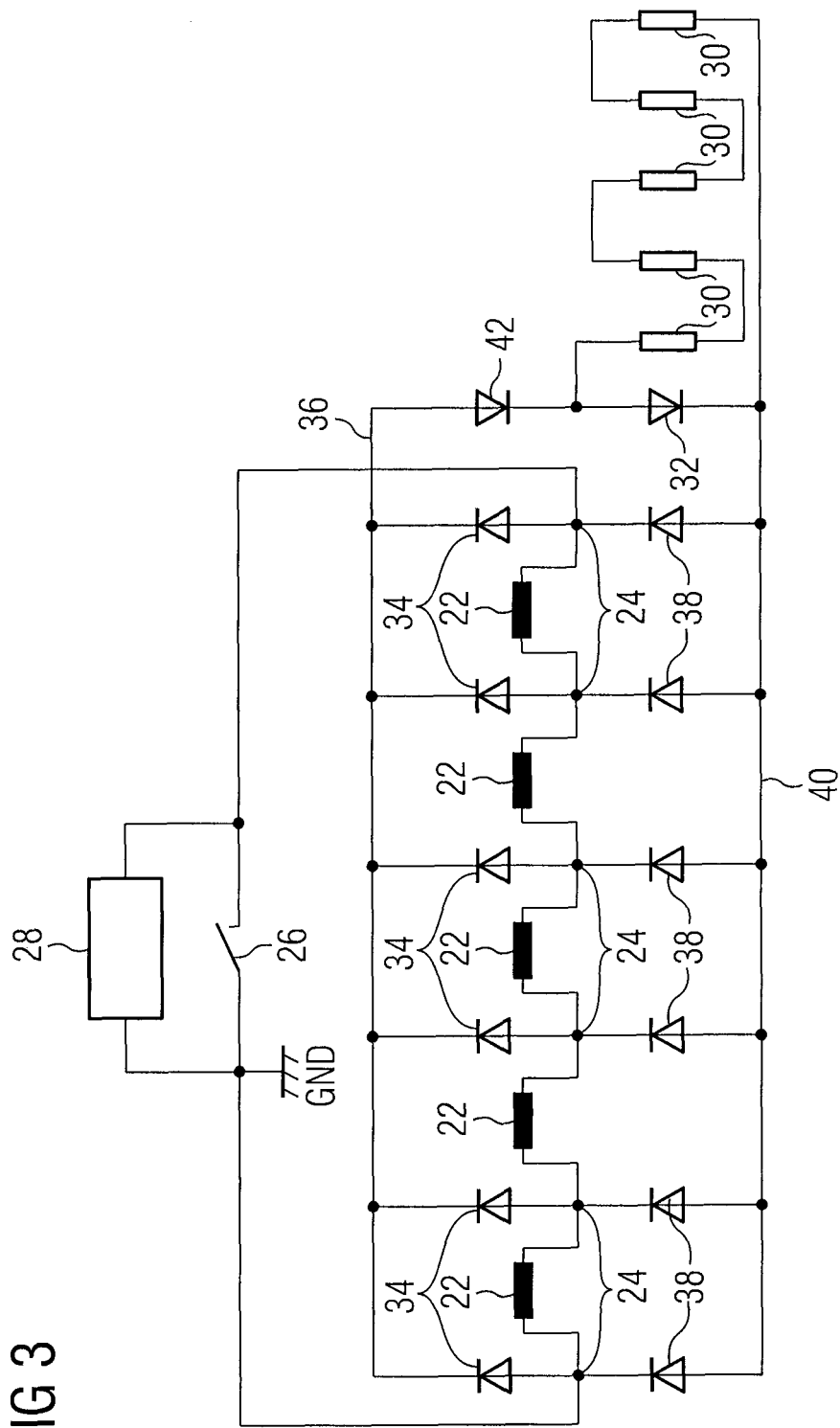
FIG. 3 shows a circuit diagram of a quench propagation arrangement according to another embodiment of the present invention.

FIG. 3 shows an alternative arrangement in which the heaters 30 are connected in series, with the voltage limiter 32 connected across the series combination of heaters. In such an embodiment, the voltage limit imposed by the voltage limiter 32 may need to be higher than in embodiments such as shown in FIG. 2. This can be achieved by placing more diodes in series with diode 32.

The variants shown in FIGS. 2 and 3 may of course be combined to form other alternative embodiments.

The present invention accordingly provides a quench propagation arrangement for a superconductive magnet comprising a plurality of series-connected superconducting coils, which is rapid in operation, avoids excessive voltage generation and thereby allows a reduced mass of superconducting wire to be used, enabling reduced mass, higher field strength designs.

The invention claimed is:

1. A quench propagation arrangement for a superconducting magnet comprising:
    first and second series-connected superconducting coils each being connected on a first side to a common node, the first superconducting coil being connected on a second side to a first node;
    a first diode having a cathode connected to a positive supply line and an anode connected to the common node;
    a second diode having a cathode connected to the positive supply line and an anode connected to the first node;
    a third diode having an anode connected to a negative supply line and a cathode connected to the common node;
    a fourth diode having an anode connected to the negative supply line and a cathode connected to the first node;
    a number of heaters, respectively thermally connected to each of the superconducting coils and electrically connected between the positive supply line and the negative supply line; and
    a voltage limiter connected between the positive supply line and the negative supply line, in parallel with the heaters.

2. An arrangement according to claim 1, further comprising a diode connected in series between one of the supply lines and the parallel combination of heaters and the voltage limiter.

3. An arrangement according to claim 1, wherein the heaters are themselves connected in parallel, each in parallel with the voltage limiter.

4. An arrangement according to claim 1, wherein the heaters are themselves connected in series, the series combination of heaters being connected in parallel with the voltage limiter.

5. An arrangement according to claim 1, wherein the voltage limiter consists of at least one diode.

* * * * *